(12) United States Patent
Gosselin

(10) Patent No.: US 7,983,019 B2
(45) Date of Patent: Jul. 19, 2011

(54) CAPACITOR BASED TRANSFORMER

(76) Inventor: Francois Gosselin, Rockland (CA)

( * ) Notice: Subject to any disclaimer, the term of this patent is extended or adjusted under 35 U.S.C. 154(b) by 238 days.

(21) Appl. No.: 12/086,963

(22) PCT Filed: Dec. 21, 2006

(86) PCT No.: PCT/CA2006/002108
§ 371 (c)(1),
(2), (4) Date: Jun. 3, 2009

(87) PCT Pub. No.: WO2007/071058
PCT Pub. Date: Jun. 28, 2007

(65) Prior Publication Data
US 2009/0322308 A1 Dec. 31, 2009

(51) Int. Cl.
*H01G 5/00* (2006.01)
(52) U.S. Cl. .......................................... 361/277; 361/290
(58) Field of Classification Search ............... 361/277, 361/271, 278, 290; 307/109; 323/293
See application file for complete search history.

(56) References Cited

U.S. PATENT DOCUMENTS

| 3,631,472 A | 12/1971 | Lincoln |
| 4,561,038 A | 12/1985 | Hatton et al. |
| 6,418,006 B1 * | 7/2002 | Liu et al. .................. 361/277 |

FOREIGN PATENT DOCUMENTS

CA        1 123 523      5/1982

* cited by examiner

*Primary Examiner* — Shawn Riley
(74) *Attorney, Agent, or Firm* — Muirhead and Saturnelli, LLC

(57) ABSTRACT

A device for generating a voltage comprises first and second plates spaced apart from each other, for being charged at respective different potentials. A third plate is placed at a first distance from the first plate so as to form a first capacitor, and a first semiconductor element is connected between the third plate and the second plate. This voltage generating device produces an output voltage having an amplitude that is dependent upon the first distance and taken between the third and second plates.

25 Claims, 4 Drawing Sheets

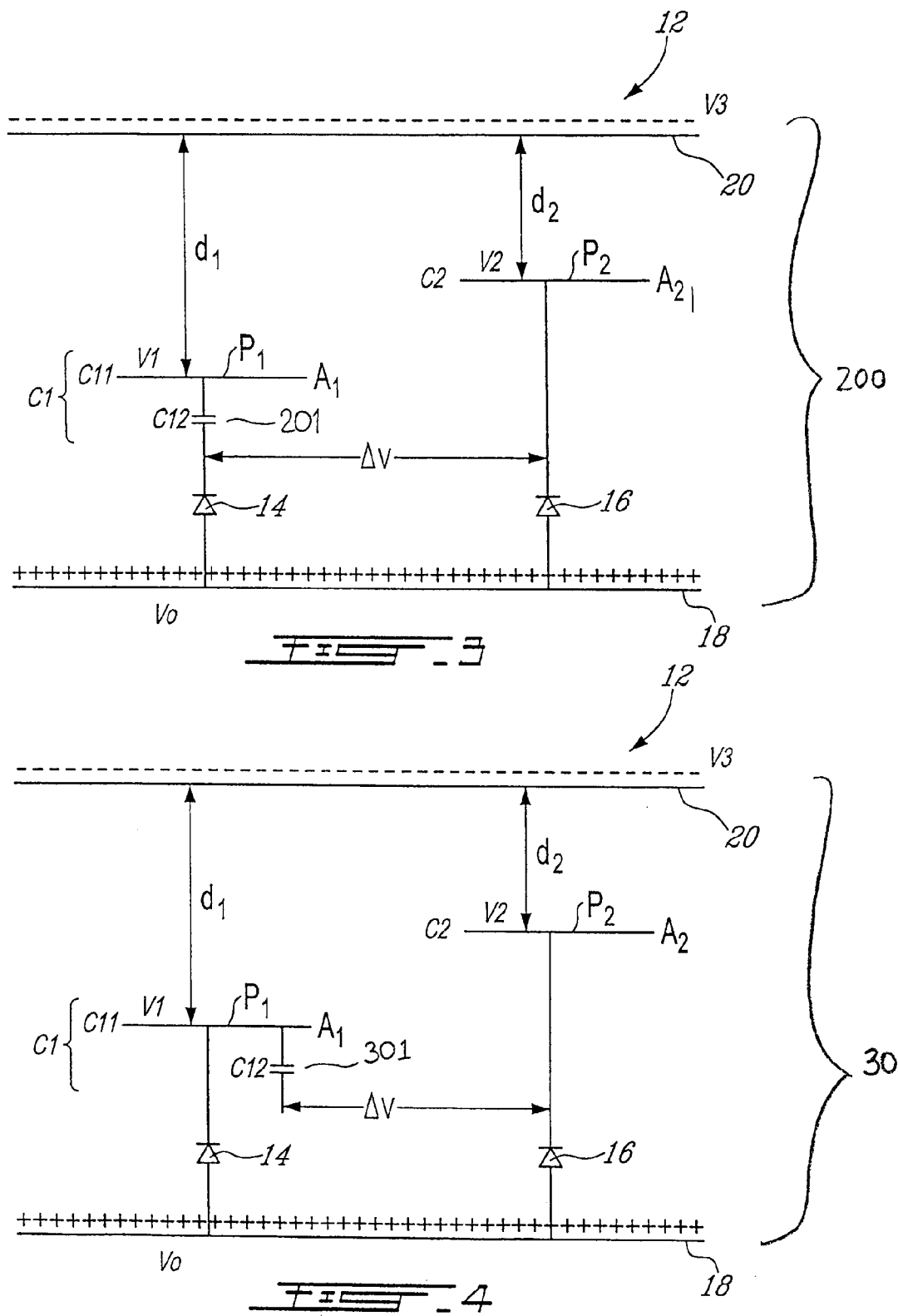

US 7,983,019 B2

CAPACITOR BASED TRANSFORMER

FIELD OF THE INVENTION

The present invention generally relates to electric power transformers. More specifically, the present invention is concerned with a static capacitor-effect based transformer that transforms electrical power from a higher voltage to a lower voltage.

BACKGROUND OF THE INVENTION

Many types of electrical transformers may be found in patent literature. Conventional electrical transformers generally involve the use of magnetic fields to transform electric voltages and/or currents.

OBJECTS OF THE INVENTION

An object of the present invention is therefore to provide a capacitor based electric transformer.

SUMMARY OF THE INVENTION

More specifically, in accordance with a first aspect of the present invention, there is provided a device for generating a voltage comprising: first and second plates spaced apart from each other, for being charged at respective different potentials; a third plate placed at a first distance from the first plate so as to form a first capacitor; and a first semiconductor element connected between the third plate and the second plate. The voltage generating device produces an output voltage having an amplitude which is dependent upon the first distance and taken between the third and second plates.

This device for generating a voltage may comprise a fourth plate placed at a second distance from the first plate so as to form a second capacitor; and a second semiconductor element connected between the fourth plate and the second plate. In this case, the voltage generating device produces an output voltage having an amplitude dependent upon the first and second distances and then taken between the third and fourth plates, instead of between the third and the second plates.

According to a second aspect of the present invention, there is provided a device for generating an output voltage from an input voltage, the device comprising a first series circuit comprising a first capacitor having a first capacitance value and a semiconductor element connected in series with the first capacitor. The input voltage is applied across the first series circuit and the output voltage has an amplitude which is dependent upon the input voltage and the first capacitance value and is taken across the first semiconductor element.

This device for generating an output voltage may further comprise a second series circuit connected in parallel with the first series circuit, the second series circuit comprising a second capacitor having a second capacitance value and a second semiconductor element connected in series with the second capacitor. In this case, the output voltage has an amplitude which is dependent upon the input voltage and the first and second capacitance values and is taken between a first point between the first capacitor and the first semiconductor element and a second point between the second capacitor and the second semiconductor element, instead of across the first semiconductor element.

The foregoing and other objects, advantages and features of the present invention will become more apparent upon reading of the following non-restrictive description of illustrative embodiments thereof, given by way of example only with reference to the accompanying drawings.

BRIEF DESCRIPTION OF THE DRAWINGS

In the appended drawings:

FIG. 3 is a schematic view of a capacitor based transformer according to a third illustrative embodiment of the present invention;

FIG. 4 is a schematic view of a capacitor based transformer according to a fourth illustrative embodiment of the present invention;

DETAILED DESCRIPTION

Figure 1:
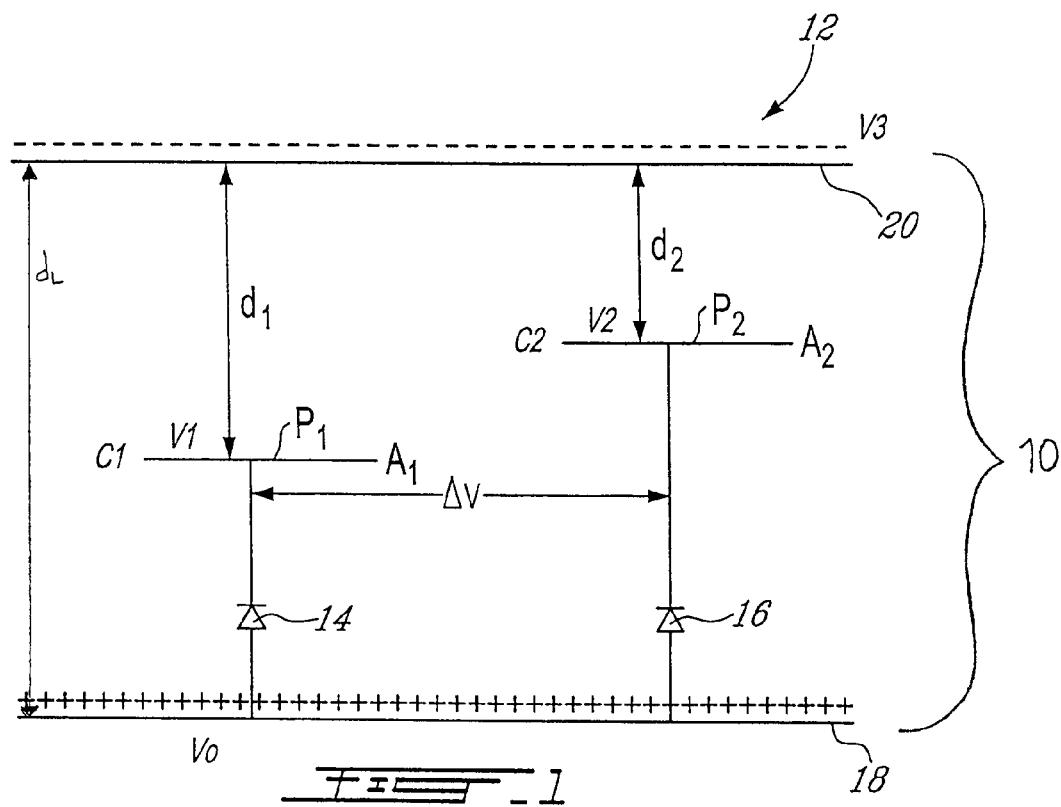
FIG. 1 is a schematic view of a capacitor based transformer according to a first illustrative embodiment of the present invention.

FIG. 1 of the appended drawings is a schematic view of a capacitor based transformer 10 according to a first illustrative embodiment of the present invention.

As illustrated in FIG. 1, the capacitor based transformer 10 comprises a larger capacitor 12. Two smaller plates P1 and P2 are each connected via respective semiconductor elements, for example diodes 14 and 16 to a same plate 18 of the larger capacitor 12. Also, the smaller plates P1 and P2 can be positioned at respective, different distances $d_1$ and $d_2$ from the other plate 20 of the larger capacitor 12.

In FIG. 1:

$V_0$ denotes the electric potential (in volts) of the plate 18 of the larger capacitor 12;

$V_1$ denotes the electric potential (in volts) of the plate P1 connected to the plate 18 of the capacitor 12 through the diode 14;

$V_2$ denotes the electric potential (in volts) of the plate P2 connected to the plate 18 of the capacitor 12 through the diode 16;

$V_3$ denotes the electric potential (in volts) of the plate 20 of the capacitor 12;

$\Delta V$ denotes the potential difference (in volts) $V_1$-$V_2$ between the plates P1 and P2 and represents the output voltage of the transformer 10;

$d_1$ denotes the distance (in meters) between the plate P1 and the plate 20 of the capacitor 12;

$d_2$ denotes the distance (in meters) between the plate P2 and the plate 20 of the capacitor 12;

$d_L$ denotes the distance (in meters) between the plates 18 and 20 of the capacitor 12;

$C_1$ denotes the capacitance (in farads) between the plates P1 and 20 forming a first capacitor;

$C_2$ denotes the capacitance (in farads) between the plates P2 and 20 forming a second capacitor;

$A_1$ is the surface area (in square meters) of the plate P1; and $A_2$ is the surface area (in square meters) of the plate P2 ($A_1$ can be equal to $A_2$ but does not have to be).

Still referring to FIG. 1, the diodes 14 and 16 have respective cathodes connected to the plates P1 and P2, respectively, and respective anodes both connected to the plate 18 of the capacitor 12. The diodes 14 and 16 are selected as a function of the current to be drawn through them. The general purpose of the diodes 14 and 16 is to ensure a potential difference between the plates P1 and P2 and the plate 18 of the larger capacitor 12.

FIG. 1 also shows that the plates 18 and 20 of the larger capacitor 12 have been assigned an arbitrary charge (+ or −) for illustration purposes.

For example, a magnetohydrodynamics (MHD) generator could be used to charge the plates 18 and 20 of the larger capacitor 12. Since MHD technology is believed well known to those of ordinary skill in the art and is not particularly relevant to the present invention, it will not be further discussed in the present specification.

As will easily be understood by one skilled in the art, other technologies could be used to charge the plates 18 and 20 of the larger capacitor 12 without departing from the spirit and nature of the present invention.

The operation of the capacitor based transformer 10 of FIG. 1 can be explained as follows. Generally, the voltage V (in volts) across a capacitor is given by:

$$V = \frac{Q}{C}$$

where Q is the charge (in coulombs); and
where C is the capacitance (in farads).
The capacitance C (in farads) across a capacitor is given by:

$$C = \Sigma_o \frac{KA}{d}$$

where $\Sigma_o$ is the permittivity of vacuum ($8.885 \times 10^{-12}$);
K is the relative permittivity of the dielectric material between the plates (K=1 for free space, K>1 for all media, approximately =1 for air);
A is the area of the plates of the capacitor; and
d is the distance between the plates.
Combining the above equations for V and C thus yields:

$$V = \frac{Q}{C} = \frac{Qd}{\Sigma_o KA}$$

And if the charge density is given by $Q_a=Q/A$, then $Q=Q_a A$, substituting and solving yields:

$$V = \frac{Q_a d}{\Sigma_o K}$$

Thus, from FIG. 1, the charge difference across the larger capacitor 12 forces a charge up to plate P1 and up to plate P2. The diodes 14 and 16 respectively connecting the plates P1 and P2 to the plate 18 will ensure that a potential difference is produced between the plates P1 and P2 and the plate 18 of the larger capacitor 12, since the distance $d_1$ is not equal to $d_2$. Then, solving for the equations above, and assuming that $A_1=A_2$, yields:

$$\Delta V = V_1 - V_2 = \frac{Q_1}{C_1} - \frac{Q_2}{C_2} = \frac{Q_a(d_1 - d_2)}{\Sigma_o K}$$

Thus, by increasing the difference ($d_1-d_2$) between the distances $d_1$ and $d_2$ between the plates P1 and P2 and the plate 20 of the larger capacitor 12, one can increase the output voltage $\Delta V$, independently of the area of the plates P1 and P2. In other words, adjusting the distances $d_1$ and $d_2$ will allow adjustment of the amplitude of the output voltage $\Delta V$ of the capacitor based transformer 10.

Therefore the arrangement of FIG. 1 provides a means to transform electric power, without recourse to moving components, even when one does not have access to both poles of the source originally powering the larger capacitor 12. The plates 18 and 20 of the larger capacitor 12 may be a solid, a liquid, a plasma or a combination thereof.

Figure 2:
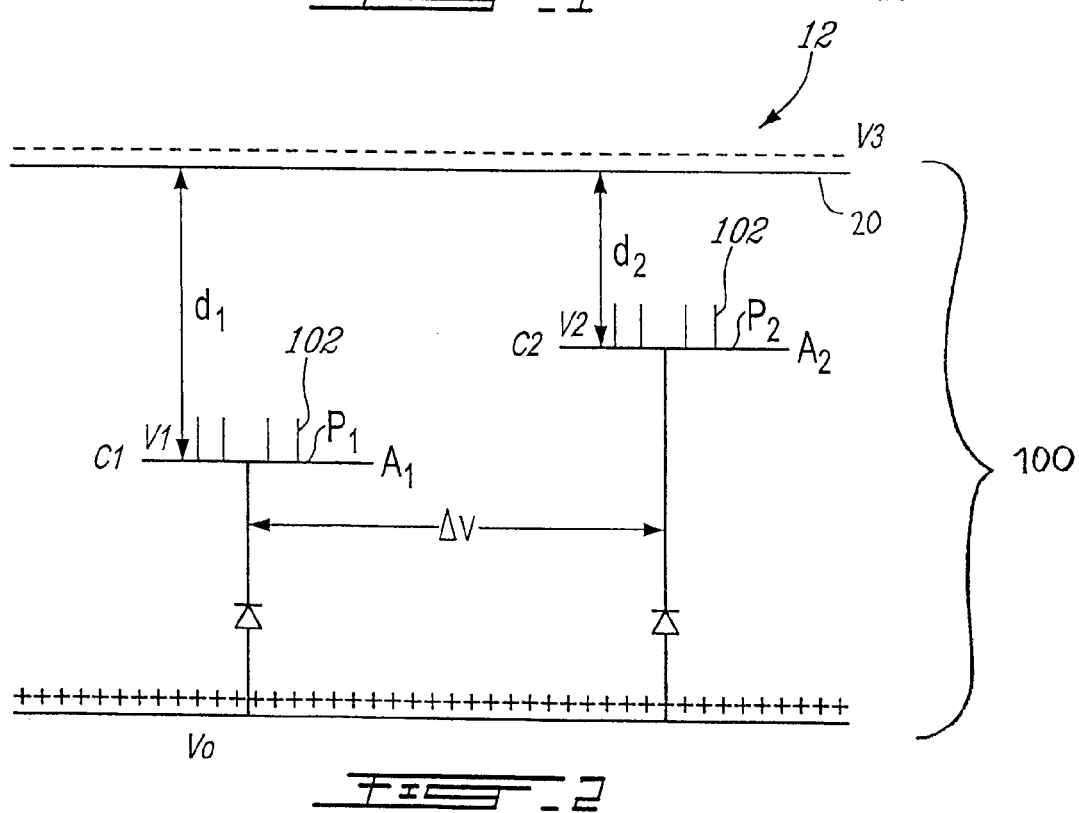
FIG. 2 is a schematic view of a capacitor based transformer according to a second illustrative embodiment of the present invention.

FIG. 2 is a schematic view of a capacitor based transformer 100 according to a second illustrative embodiment of the present invention.

The capacitor based transformer 100 illustrated in FIG. 2 is very similar to the transformer 10 of FIG. 1. The main difference is that the plates P1 and P2 both include spikes 102 pointing toward the plate 20 of the larger capacitor 12, in view of increasing the voltage of the transformer without changing any other parameter. Given that in a capacitor, the electric field E is given by E=$Q_a$/d, placing numerous "spikes" such as 102 on the plates P1 and P2 as illustrated in FIG. 2 will increase the electric field between each plate P1 and P2 and the plate 20 of the larger capacitor 12. This increase in electric field E will increase the output voltage $\Delta V$ produced by the transformer 100.

FIG. 3 is a schematic view of a third illustrative embodiment of a capacitor based transformer 200. As can be seen, the capacitor based transformer 200 is very similar to the capacitor based transformer 10 illustrated in FIG. 1.

The main difference between the transformers 10 and 200 is concerned with the addition of a capacitor 201 interposed between the cathode of the diode 14 and the plate P1 to form a series circuit with the diode 14 and the capacitor formed by the plates P1 and 20 to thereby increase the amplitude of the output voltage $\Delta V$ of the transformer 200, then taken between (a) the point between the diode 14 and the capacitor 201 and (b) the plate P2. The capacitor 201 can be a single physical capacitor or a group of capacitors connected in series and/or parallel.

The resulting capacitance is given by:

$$C_1 = \frac{C_{11} C_{12}}{C_{11} + C_{12}}$$

In this equation:
$C_1$ denotes the total capacitance (in farads) of the series circuit including the capacitor formed by the plates P1 and 20 and the additional capacitor 201;
$C_{11}$ denotes the capacitance (in farads) of the capacitor formed by the plates P1 and 20;
$C_{12}$ denotes the capacitance (in farads) of the additional capacitor 201.

By adding the capacitor 201 in series with the capacitor formed by the plates P1 and 20, the value of the capacitance $C_1$ is reduced and the value of $\Delta V$, the output voltage of the transformer 200, is therefore boosted, since V=Q/C. The added capacitor 201 can be of a fixed capacitance value (as illustrated) or be of the variable type (such as a varactor, not shown). Although not illustrated that way, the capacitor 201 can also be itself composed of multiple capacitors in series/or parallel arrangement or a combination thereof. Each capacitor could be separated by semiconductor elements, for example, such as diodes.

And so, combining this equation for the capacitance $C_1$ with the one for the output voltage $\Delta V$ yield:

$$\Delta V = V_1 - V_2 = \frac{Q_1}{C_1} - \frac{Q_2}{C_2} = \frac{Q_a A_1}{C_{12}} + \frac{Q_a(d1-d2)}{\Sigma_o K}$$

FIG. 4 illustrates a capacitor based transformer 300 according to a fourth illustrative embodiment of the present invention. The transformer 300 is very similar to the transformer 200 but the added capacitor 301 is not in series with the diode 14 as in the transformer 200 but in parallel therewith.

Figure 5:
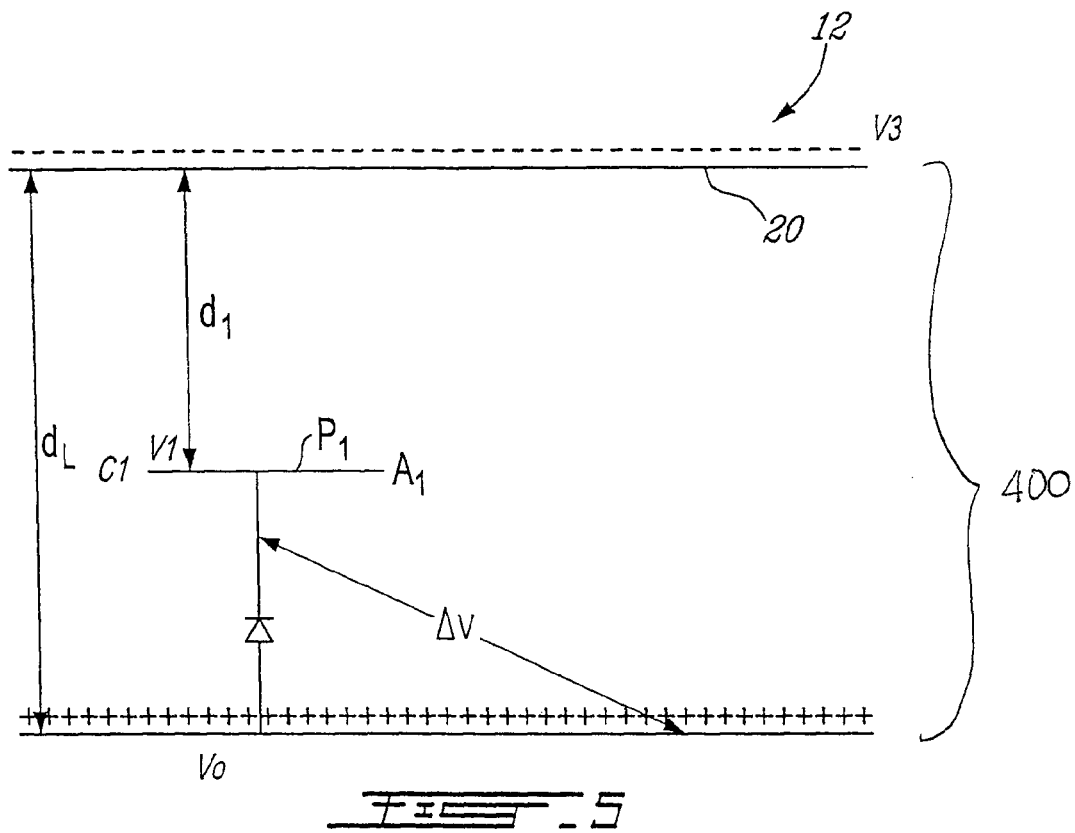
FIG. 5 is a schematic view of a capacitor based transformer according to a fifth illustrative embodiment of the present invention.

Turning now to FIG. 5 of the appended drawings, a transformer 400 according to a fifth illustrative embodiment of the present invention will be described. The transformer 400 includes a single plate P1 and the output voltage $\Delta V$ of the transformer 400 is taken between the plate P1 and the plate 18 of the larger transformer 12. Accordingly:

$$\Delta V = V_1 - V_0 = \frac{Q_1}{C_1} - V_0 = \frac{Q_a d_1}{\Sigma_o K} - V_0$$

It is to be noted that the transformer 400 of FIG. 5 could be provided with an additional, smaller capacitor (not shown) to increase the output voltage $\Delta V$. This capacitor could be connected as illustrated in FIG. 3 or 4, in which cases:

$$\Delta V = V_1 - V_0 = \frac{Q_1}{C_1} - V_0 = \frac{Q_a A_1}{C_{12}} + \frac{Q_a d_1}{\Sigma_o K} - V_0$$

Figure 6:
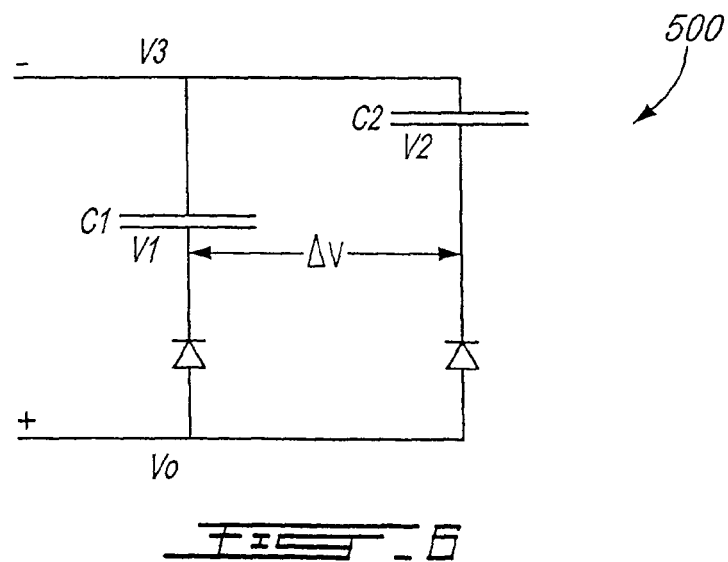
FIG. 6 is a schematic view of a capacitor based transformer according to a sixth illustrative embodiment of the present invention.

FIG. 6 illustrates a transformer 500 according to a sixth illustrative embodiment of the present invention. The main difference between the capacitor based transformer 500 of FIG. 6 and the capacitor based transformer 10 of FIG. 1 is that the larger capacitor 12 and plates P1 and P2 arrangement of the capacitor based transformer 10 has been replaced in transformer 500 by conventional capacitors $C_1$ and $C_2$ that can be fixed or variable capacitors having different values.

It is to be noted that the transformer 500 could be provided with an additional smaller capacitor (not shown) to increase its output voltage $\Delta V$. This latter capacitor could be connected as illustrated in FIG. 3 or 4.

Figure 7:
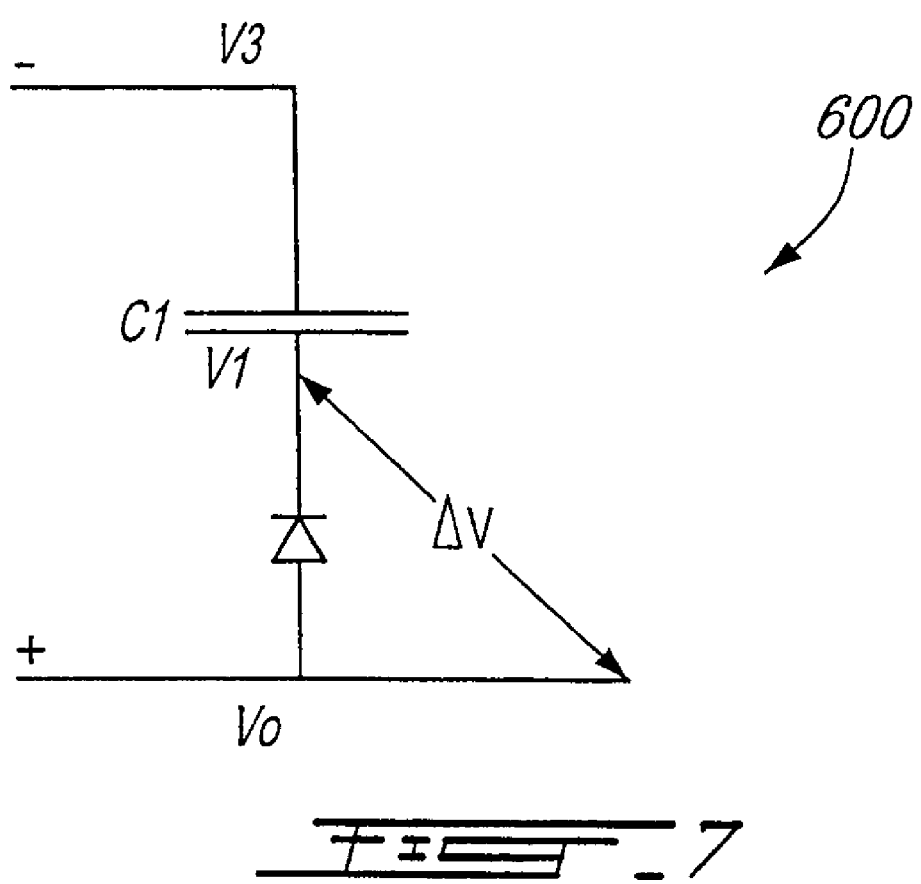
FIG. 7 is a schematic view of a capacitor based transformer according to a seventh illustrative embodiment of the present invention.

Finally, FIG. 7 illustrates a transformer 600 according to a seventh illustrative embodiment of the present invention. The transformer 600 is very similar to the transformer 500 of FIG. 6, but the capacitor $C_2$ has been removed.

It is to be noted that the transformer 600 could be provided with an additional smaller capacitor (not shown) to increase its output voltage. This capacitor could be connected as illustrated in FIG. 3 or 4.

It is also to be noted that the output of the transformers illustrated herein may be supplied to conditioning and/or regulating circuits, for example to achieve a specific DC or AC voltage and/or a specific AC or DC current.

Transformers according to the non-restrictive illustrative embodiments of the present invention may be used as DC-DC or DC-AC transformers in a wide range of uses including, but not limited to:

Power supplies in electrical equipment;
Power generation and transmission equipments;
Homes, buildings, transportation, military, factories;
Applications where there is a need for adjusting the electric voltage and/or the power;
Applications where one of the plates of the larger capacitor such as 12 may be a solid, a liquid, a gas, a plasma or a combination thereof, such as, for example, the exhaust of a MHD generator;
Applications where a magnetic field may be undesirable, such as, for example, in the vicinity of IC chips, microprocessors, etc.

The non-restrictive illustrative embodiments of the present invention present many advantages over the current magnetic transformers such as, for example:

Ease to manufacture;
Low cost to manufacture;
In some cases, it may be the only way to built a transformer, for example when one of the plates of the larger capacitor such as 12 is a gas or a plasma; and
Operation at potentially lower temperatures than existing transformers since there is no heat generating coils such as those found in conventional transformers.

Although the present invention has been described hereinabove by way of non-restrictive illustrative embodiments thereof, these embodiments can be modified at will within the scope of the appended claims, without departing from the spirit and nature of the subject invention.

What is claimed is:

1. A device for generating a voltage comprising:
first and second plates spaced apart from each other, for being charged at respective different potentials;
a third plate placed at a first distance from the first plate so as to form a first capacitor; and
a first semiconductor element connected between the third plate and the second plate;
wherein the voltage generating device produces an output voltage having an amplitude which is dependent upon the first distance and taken between the third and second plates.

2. A device for generating a voltage according to claim 1, further comprising:
a fourth plate placed at a second distance from the first plate so as to form a second capacitor; and
a second semiconductor element connected between the fourth plate and the second plate;
wherein the voltage generating device produces an output voltage having an amplitude dependent upon the first and second distances and then taken between the third and fourth plates, instead of between the third and the second plates.

3. A device for generating a voltage according to claim 1, wherein the first semiconductor element comprises a first diode.

4. A device for generating a voltage according to claim 3, wherein the first diode has a cathode connected to the third plate and an anode connected to the second plate.

5. A device for generating a voltage according to claim 2, wherein the first and second semiconductor elements comprise first and second diodes, respectively.

6. A device for generating a voltage according to claim 5, wherein the first diode has a cathode connected to the third plate and an anode connected to the second plate and the second diode has a cathode connected to the fourth plate and an anode connected to the second plate.

7. A device for generating a voltage according to claim 2, wherein the amplitude of the output voltage is dependent upon a difference between the first and second distances.

8. A device for generating a voltage according to claim 2, wherein the amplitude of the output voltage is adjusted by adjusting a difference between the first and second distances.

9. A device for generating a voltage according to claim 1, wherein the first and second plates spaced apart from each other define a third larger capacitor.

10. A device for generating a voltage according to claim 1, wherein at least one of the first and second plates is made from an element selected from the group consisting of a solid, liquid, gas, plasma, or a combination thereof.

11. A device for generating a voltage according to claim 9, wherein the third and fourth plates are located between the first and second plates of the third larger capacitor.

12. A device for generating a voltage according to claim 2, wherein at least one additional capacitor is serially connected to at least one of the first and second capacitors for increasing the amplitude of the output voltage, the output voltage being taken between the additional capacitor and the other one of said first and second capacitors.

13. A device for generating a voltage according to claim 12, wherein the at least one additional capacitor is further connected in parallel with the corresponding one of said first and second semiconductor elements.

14. A device for generating a voltage according to claim 2, wherein at least one of the third and fourth plates comprises spikes for increasing the amplitude of the output voltage.

15. A device for generating an output voltage from an input voltage, the device comprising:
a first series circuit comprising a first capacitor having a first capacitance value and a semiconductor element connected in series with the first capacitor;
wherein:
the input voltage is applied across the first series circuit; and
the output voltage has an amplitude which is dependent upon the input voltage and the first capacitance value and is taken across the first semiconductor element.

16. A device for generating an output voltage according to claim 15, further comprising:
a second series circuit connected in parallel with the first series circuit, the second series circuit comprising a second capacitor having a second capacitance value and a second semiconductor element connected in series with the second capacitor;
wherein the output voltage has an amplitude which is dependent upon the input voltage and the first and second capacitance values and is taken between a first point between the first capacitor and the first semiconductor element and a second point between the second capacitor and the second semiconductor element, instead of across the first semiconductor element.

17. A device for generating an output voltage according to claim 16, wherein the first and second semiconductor elements comprise first and second diodes, respectively.

18. A device for generating an output voltage according to claim 17, wherein the first diode has a cathode connected to the first capacitor, the second diode has a cathode connected to the second capacitor, and the first and second diodes have respective interconnected anodes.

19. A device for generating an output voltage according to claim 18, wherein the first point is located between the cathode of the first diode and the first capacitor and the second point is located between the cathode of the second diode and the second capacitor.

20. A device for generating an output voltage according to claim 16, wherein at least one additional capacitor is serially connected to at least one of the first and second capacitors for increasing the amplitude of the output voltage, the output voltage being then taken between the additional capacitor and the other one of said first and second capacitors.

21. A device for generating an output voltage according to claim 20, wherein the at least one additional capacitor is further connected in parallel with the corresponding one of said first and second semiconductor elements.

22. A device for generating an output voltage according to claim 15, wherein the first capacitor comprises a fixed capacitor.

23. A device for generating an output voltage according to claim 15, wherein the first capacitor comprises a variable capacitor.

24. A device for generating an output voltage according to claim 16, wherein the first and second capacitors comprise respective fixed capacitors.

25. A device for generating an output voltage according to claim 16, wherein the first and second capacitors comprise respective variables capacitors.

* * * * *